US007786971B2

(12) United States Patent
Chung et al.

(10) Patent No.: US 7,786,971 B2

(45) Date of Patent: Aug. 31, 2010

(54) FLAT DISPLAY APPARATUS CAPABLE OF COMPENSATING A PANEL DEFECT ELECTRICALLY AND PICTURE QUALITY CONTROLLING METHOD THEREOF

(75) Inventors: In Jae Chung, Gwachoen-si (KR); Jong Hee Hwang, Osan-si (KR); Sun Young Kim, Hwaseong-si (KR)

(73) Assignee: LG. Display Co., Ltd., Seoul (KR)

( * ) Notice: Subject to any disclaimer, the term of this patent is extended or adjusted under 35 U.S.C. 154(b) by 856 days.

(21) Appl. No.: 11/478,993

(22) Filed: Jun. 29, 2006

(65) Prior Publication Data

US 2007/0091042 A1 Apr. 26, 2007

(30) Foreign Application Priority Data

Oct. 25, 2005 (KR) ..................... 10-2005-0100934

(51) Int. Cl.

*G09G 3/36* (2006.01)
*G02F 1/13* (2006.01)
*G01R 31/00* (2006.01)

(52) U.S. Cl. .......................... 345/98; 345/99; 349/192; 324/770

(58) Field of Classification Search ........... 345/87–104, 345/204, 690; 324/770; 348/177–194; 349/192
See application file for complete search history.

(56) References Cited

U.S. PATENT DOCUMENTS 4,738,514 A 4/1988 Stewart
6,369,810 B1 * 4/2002 Ijntema ...................... 345/214
6,704,008 B2 * 3/2004 Naito et al. ................. 345/207
6,825,824 B2 * 11/2004 Lee ............................ 345/89
2005/0093798 A1 * 5/2005 Kamada et al. ............... 345/89
2005/0116917 A1 * 6/2005 Aoki .......................... 345/99

FOREIGN PATENT DOCUMENTS

CN 1149528 5/1997
EP 1 583 063 A1 10/2005
JP 07-261719 10/1995
JP 08-338787 12/1996
JP 11-113019 4/1999

(Continued)

OTHER PUBLICATIONS

Office Action issued in corresponding Chinese Patent Application No. 2006100871281; issued Jul. 4, 2008.

(Continued)

*Primary Examiner*—Bipin Shalwala
*Assistant Examiner*—Keith Crawley
(74) *Attorney, Agent, or Firm*—Brinks Hofer Gilson & Lione

(57) ABSTRACT

A flat panel display device and a picture quality controlling method thereof is provided. The flat panel display device includes a display panel. A memory stores location information about a panel defect location on the display panel and a compensation value to be dispersed for a plurality of frame periods. A compensating part detects the data to be displayed at the panel defect location and adjusts the data to be displayed at the panel defect location with the compensation value from the memory.

7 Claims, 17 Drawing Sheets

FOREIGN PATENT DOCUMENTS

| | | |
|---|---|---|
| JP | 2000-305532 | 11/2000 |
| JP | 2002-366109 | 12/2002 |
| JP | 2005-128254 | 5/2005 |
| JP | 2005-134560 | 5/2005 |
| JP | 2005-157316 | 6/2005 |
| JP | 2005-258142 | 9/2005 |
| TW | 472277 | 1/2002 |
| TW | 1252962 | 4/2006 |

OTHER PUBLICATIONS

Office Action issued in corresponding Japanese Patent Application No. 2006-169523; issued Nov. 11, 2009.

Copy of Office Action issued in corresponding Taiwanese Patent Application No. 095119045; issued May 24, 2010.

* cited by examiner

FLAT DISPLAY APPARATUS CAPABLE OF COMPENSATING A PANEL DEFECT ELECTRICALLY AND PICTURE QUALITY CONTROLLING METHOD THEREOF

This application claims the benefit of the Korean Patent Application No. P2005-100934 filed on Oct. 25, 2005, which is hereby incorporated by reference.

BACKGROUND

1. Field

A display device and a picture quality controlling method thereof are provided.

2. Related Art

Recently, various flat panel display devices that reduce the weight and size of the display, which has been a disadvantage of a cathode ray tube, are on the rise. The flat panel display device includes, for example, liquid crystal display, field emission display, plasma display panel, organic light emitting diode.

The flat panel display devices include a display panel for displaying a picture. A panel defect or mura defect has been found in a test process in such a display panel. The panel defect is a display spot that accompanies a brightness disparity on a display screen. The panel defects are mostly generated in a fabricating process, and might have a fixed form, for example, a dot, line, belt, circle, polygon or an undetermined form in accordance with the cause of their generation. Examples of panel defects, which have various forms are shown in FIGS. 1 to 3. FIG. 1 represents a panel defect of undetermined form. FIG. 2 represents a panel defect of vertical belt shape, and FIG. 3 represents a panel defect of dot shape.

The panel defect of vertical belt shape among them is generated because of overlapping exposure and a difference in the number of lenses. The panel defect of dot shape is generated by impurities. The picture displayed in the location of such a panel defect appears to be darker or brighter than an ambient non-defect area. Color differences are made when compared with the non-defect area.

The panel defect might be connected to the defect of products in accordance with the degree, the defect of such products drops yield, and this leads to the increase of cost. Even though the product where a panel defect is found is shipped as a good product, the picture quality is deteriorated due to the panel defect drops the reliability of the product.

Accordingly, various methods have been proposed in order to improve the panel defect. Improvement methods of the related art are mainly solve problems in the fabrication process, this is disadvantageous because it is difficult to properly deal with the panel defect generated in the improved process.

SUMMARY

A flat panel display device according to an aspect of the present invention includes a display panel. A memory stores location information about a panel defect location on the display panel and a compensation value that is dispersed during a plurality of frame periods. A compensating part detects the data to be displayed at the panel defect location and adjusts the data displayed at the panel defect location with the compensation value from the memory.

In the flat panel display device, the compensating part detects the data that are displayed at the panel defect location using at least one data timing signal among a synchronization signal, a dot clock and a data enable signal that are inputted together with the data.

In the flat panel display device, the compensation value is different for each location of the panel defect location and for each gray level of the data that are displayed at the panel defect location.

In the flat panel display device, the compensation value includes a R compensation value that compensates for red data, a G compensation value that compensates for green data and a B compensation value that compensates for blue data. The R compensation value, the G compensation value and the B compensation value are the same value in the same panel defect location and in the same gray level.

In the flat panel display device, the compensation value includes a R compensation value that compensates for red data, a G compensation value that compensates for green data and a B compensation value that compensates for blue data. At least one compensation value of the R compensation value, the G compensation value and the B compensation value is different from the other compensation value in the same panel defect location and in the same gray level.

In the flat panel display device, the memory includes a memory where data can be renewed.

In the flat panel display device, the memory includes at least any one of EEPROM and EDID ROM.

In the flat panel display device, the display panel includes a liquid crystal display panel where a plurality of data lines cross a plurality of gate lines and a plurality of liquid crystal cells are arranged. The driver includes a data drive circuit for supplying the corrected data to the data lines. A gate drive circuit supplies a scan pulse to the gate lines. A timing controller controls the drive circuits and supplies the corrected data to the data drive circuit.

In the flat panel display device, the compensating part is embedded in the timing controller.

A flat panel display device according to another embodiment includes a display panel. A memory stores location information about a panel defect location of the display panel and a compensation value that is dispersed to a plurality of pixels. A compensating part detects the data to be displayed at the panel defect location and adjusts the data to be displayed at the panel defect location with the compensation value from the memory.

A flat panel display device according to another embodiment includes a display panel. A memory stores location information about a panel defect location of the display panel and a compensation value dispersed to a plurality of frames and to a plurality of pixels. A compensating part detects the data to be displayed at the panel defect location and adjusts the data to be displayed at the panel defect location with the compensation value from the memory.

A picture quality controlling method of a flat panel display device according to still another embodiment includes the acts of measuring a panel defect in a display panel and judging the panel defect in the display panel; determining a compensation value dispersed to the panel defect location for a plurality of frame periods; detecting data to be displayed at the panel defect location; and adjusting the data to be displayed at the panel defect location with the compensation value.

In the picture quality controlling method, judging the panel defect includes the acts of measuring brightness and chromaticity of the display panel in each gray level and in each color; and judging a screen location where at least any one of the brightness and chromaticity is different in the display panel as the panel defect location.

In the act of detecting the data that are to be displayed at the panel defect location, the data that are to be displayed at the panel defect location are detected on the basis of at least any one data timing signal among a synchronization signal, a dot clock and a data enable signal which are inputted together with the data.

In the act of determining the compensation value, the compensation value is determined to be different for each location of the panel defect location and for each gray level of the data which are to be displayed at the panel defect location in accordance with a measurement result of the panel defect measured for each gray level and for each location.

In the picture quality controlling method, determining the compensation value includes the act of determining the compensation value by dividing into an R compensation value that compensates for red data, a G compensation value that compensates for green data and a B compensation value that compensates for blue data in accordance with a measurement result of the panel defect measured for each gray level, for each color and for each location. The R compensation value, the G compensation value and the B compensation value are determined to be the same value in the same panel defect location and in the same gray level.

In the picture quality controlling method, determining the compensation value includes the act of determining the compensation value by dividing into an R compensation value that compensates for red data, a G compensation value that compensates for green data and a B compensation value that compensates for blue data in accordance with a measurement result of the panel defect measured for each gray level, for each color and for each location. At least one compensation value of the R compensation value, the G compensation value and the B compensation value is different from the other compensation value in the same panel defect location and in the same gray level.

In the picture quality controlling method, determining the compensation value further includes the act of storing the compensation value at a non-volatile memory.

A picture quality controlling method of a flat panel display device according to another embodiment includes the acts of measuring a panel defect in a display panel and detecting the panel defect in the display panel; determining a compensation value to be dispersed to a plurality of pixels at the panel defect location; detecting data to be displayed at the panel defect location; and adjusting the data to be displayed at the panel defect location with the compensation value.

A picture quality controlling method of a flat panel display device according to another embodiment includes the steps of measuring a panel defect in a display panel and detecting the panel defect in the display panel; determining a compensation value dispersed for a plurality of frame periods in a panel defect location of the display panel and dispersed to a plurality of pixels; detecting data displayed at the panel defect location; and adjusting the data displayed at the panel defect location with the compensation value.

DRAWINGS

These and other objects will be apparent from the following detailed description of the embodiments with reference to the accompanying drawings, in which.

DESCRIPTION

Reference will now be made in detail to the preferred embodiments, examples of which are illustrated in the accompanying drawings.

Figure 1:
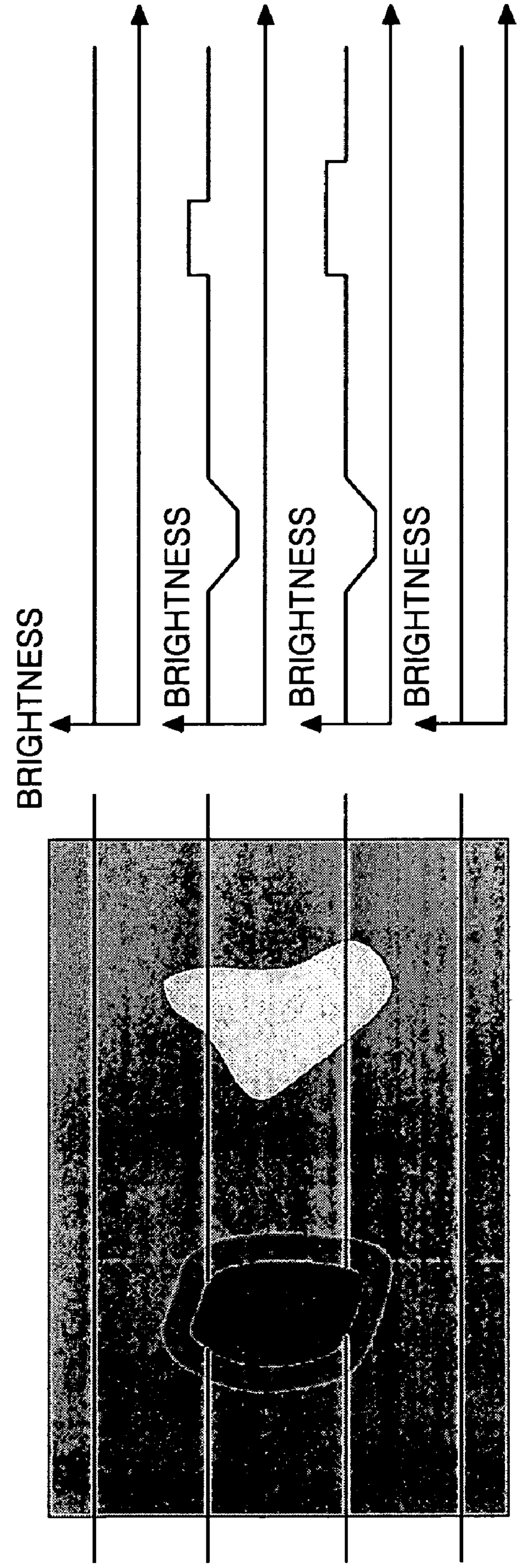
FIG. 1 RELATED ART
FIG. 1 is a view that represents a panel defect of undetermined form according to the related art.
Figure 2:
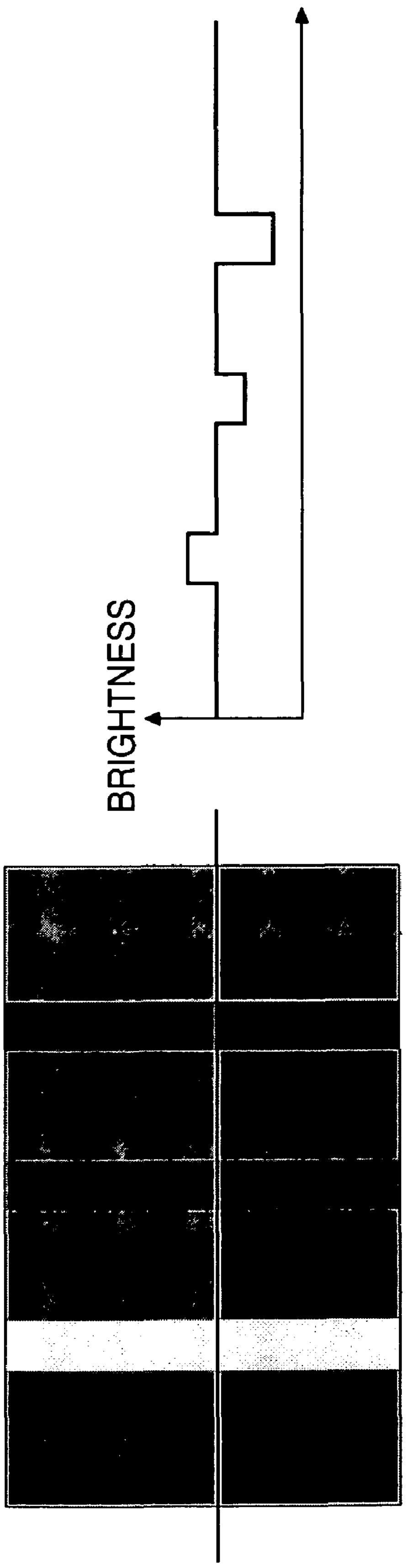
FIG. 2 RELATED ART
FIG. 2 is a view that represents a panel defect of vertical belt shape according to the related art.
Figure 3:
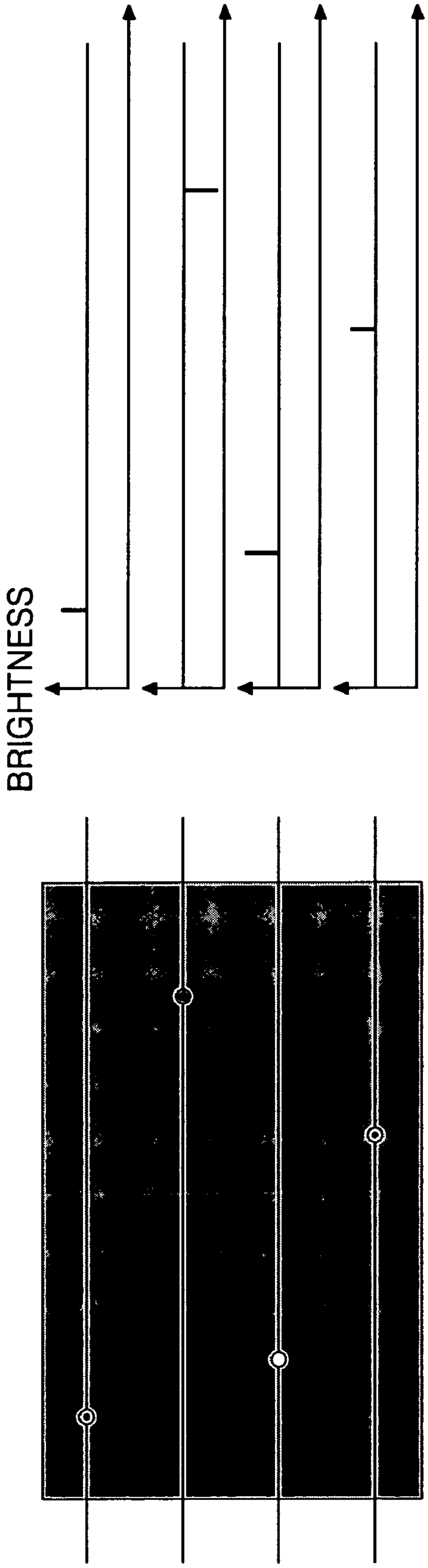
FIG. 3 RELATED ART
FIG. 3 is a view that represents a panel defect of dot shape according to the related art.
Figure 4:
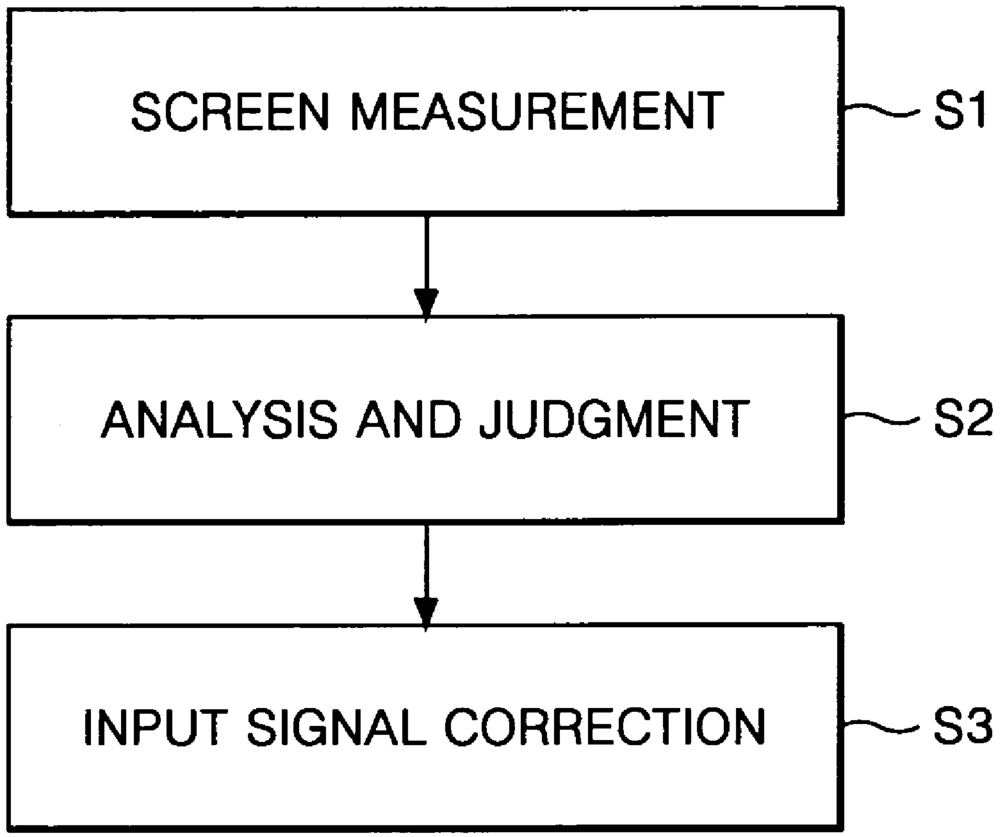
FIG. 4 illustrates a panel defect compensation method.

FIG. 4 represents a picture quality controlling method of a flat panel display device.

Referring to FIG. 4, the picture quality controlling method of the flat panel display device measures a screen state after applying an input signal to a sample flat panel display device by use of measuring equipment such as camera that detects a panel defect (S1). The picture quality controlling method of the flat panel display device according to the embodiment in the step S1 measures the display picture of the sample flat panel display device with the measuring equipment such as camera that has higher resolution than the sample flat panel display device while increasing the input signal of the flat panel display device by one gray level from the lowest gray level (black) to the highest gray level (white). For example, the picture quality controlling method of the flat panel display device according to the embodiment receives an input signal of 8 bits for each of RGB and measures total 256 screens from 0 to 255 gray level in case of the flat panel display device having a resolution of 1366×768. Each of the screens measured at this moment should have the resolution of 1366×768 or more and the brightness should have the resolution of at least 8 bits or more.

By analyzing the measured result, the picture quality controlling method of the flat panel display device judges the presence or absence of the panel defect, and then if there is the panel defect in the sample flat panel display device, the picture quality controlling method of the flat panel display device determines a compensation value that corrects the brightness or color difference of the panel defect (S2). An input video data is modulated with the compensation value to compensate for the brightness or color difference of the panel defect location. In the act S2, the picture quality controlling method of the flat panel display device finds out the location and degree of the panel defect for each gray level from the result measured in the act S1, and then determines the compensation value. The compensation value should be optimized for each location because the degree of unevenness of the brightness or color difference is different in accordance with the location of the panel defect, and also should be optimized for each gray level in consideration of a gamma characteristic as in FIG. 5.

Figure 5:
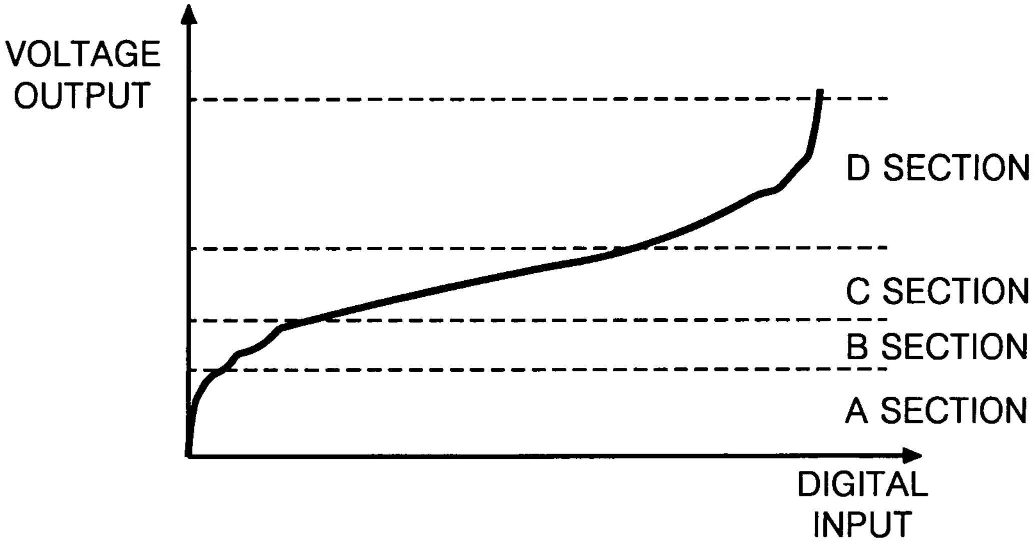
FIG. 5 is a graph that illustrates a gamma characteristic.

The compensation value can be determined for each gray level, or can be determined for each gray level section (A, B, C, D) that includes a plurality of gray levels in FIG. 5. The compensation value is determined to be an optimized value for each location, for example, '+1' in the location of 'panel defect 1', '−1' in the location of 'panel defect 2', '0' in the location of 'panel defect 3'. It can be determined as the optimized value for each gray level section, for example, '0' in 'gray level section A', '0' in 'gray level section B', '1' in 'gray level section C', '1' in 'gray level section D', etc. The compensation value can be made different in the same panel defect location for each gray level, and can also be different in the same gray level for each panel defect location. The compensation value in this embodiment is determined to be the same value in each of R,G,B data of one pixel, thus it is determined for each pixel inclusive of R,G,B sub-pixels.

The compensation value is determined differently for each of the R,G,B data when correcting the color difference. For example, if the red color appears more conspicuous in a specific panel defect location than in the non-defect location, an R compensation value becomes smaller than the G and B compensation values. The compensation value determined in this way is made into a lookup table along with the panel defect location data so as to be stored at a non-volatile memory.

The picture quality controlling method of the flat panel display device modulates an input digital video data that is to be displayed at the panel defect location by use of the compensation value determined in the step S2, thereby compensating brightness difference and color difference with a non-defect location of a picture which is to be displayed at the panel defect location (S3).

In the act S3, the picture quality controlling method of the flat panel display device according to the first embodiment stores location information about the panel defect location and the compensation value, which corresponds to the panel defect location and is optimized in accordance with the gray level of the input digital video data, at a memory and makes the compensation value dispersed to a plurality of frames by use of a frame rate control FRC method if the input digital video data is judged to be the data which is to be displayed at the panel defect location by judging the display location and gray level of the input digital video data.

The picture quality controlling method of the flat panel display device according to a second embodiment stores location information about the panel defect location and the compensation value, which corresponds to the panel defect location and is optimized in accordance with the gray level of the input digital video data, at a memory and makes the compensation value dispersed to a plurality of adjacent pixels by use of a dithering method if the input digital video data is judged to be the data that is to be displayed at the panel defect location by judging the display location and gray level of the input digital video data.

The picture quality controlling method of the flat panel display device according to a third embodiment stores location information about the panel defect location and the compensation value, which corresponds to the panel defect location and is optimized in accordance with the gray level of the input digital video data, at a memory and makes the compensation value dispersed to a plurality of frames by use of a frame rate control FRC method and to a plurality of adjacent pixels by use of a dithering method if the input digital video data is judged to be the data which is to be displayed at the panel defect location by judging the display location and gray level of the input digital video data.

The frame rate control method and the dithering method are image control methods that use an integration effect of a visual sense. The frame rate control method is a picture quality controlling method that temporally arranges the pixels that express another hue or gray level to make an image that expresses a hue or gray level therebetween. The temporal arrangement of the pixels has a frame period as a unit. The frame period is a field period, which is a display period of one screen when data are applied to all the pixels of one screen, and is standardized to be 1/60 seconds in case of NTSC method and 1/50 seconds in case of PAL method. The dithering method is a picture quality controlling method that spatially arranges the pixels that express another hue or gray level to make an image that expresses a hue or gray level therebetween.

An explanation will be made for the frame rate control method and the dithering method, in reference to FIGS. 6 to 8. For example, in case of expressing an intermediate gray level such as ¼ gray level, ½ gray level, ¾ gray level in the screen composed of pixels where only a 0 gray level and a 1 gray level can be displayed, in the frame rate control method, if the 0 gray level is displayed in any one pixel for the three frames among the four frames that makes one frame group and are sequential and the 1 gray level is displayed for one frame, as shown in (a) of FIG. 6, then an observer observes the ¼ gray level for the pixel. In the same manner, the ½ gray level and the ¾ gray level are also expressed, as shown in (b) and (c) of FIG. 6.

Figure 7:
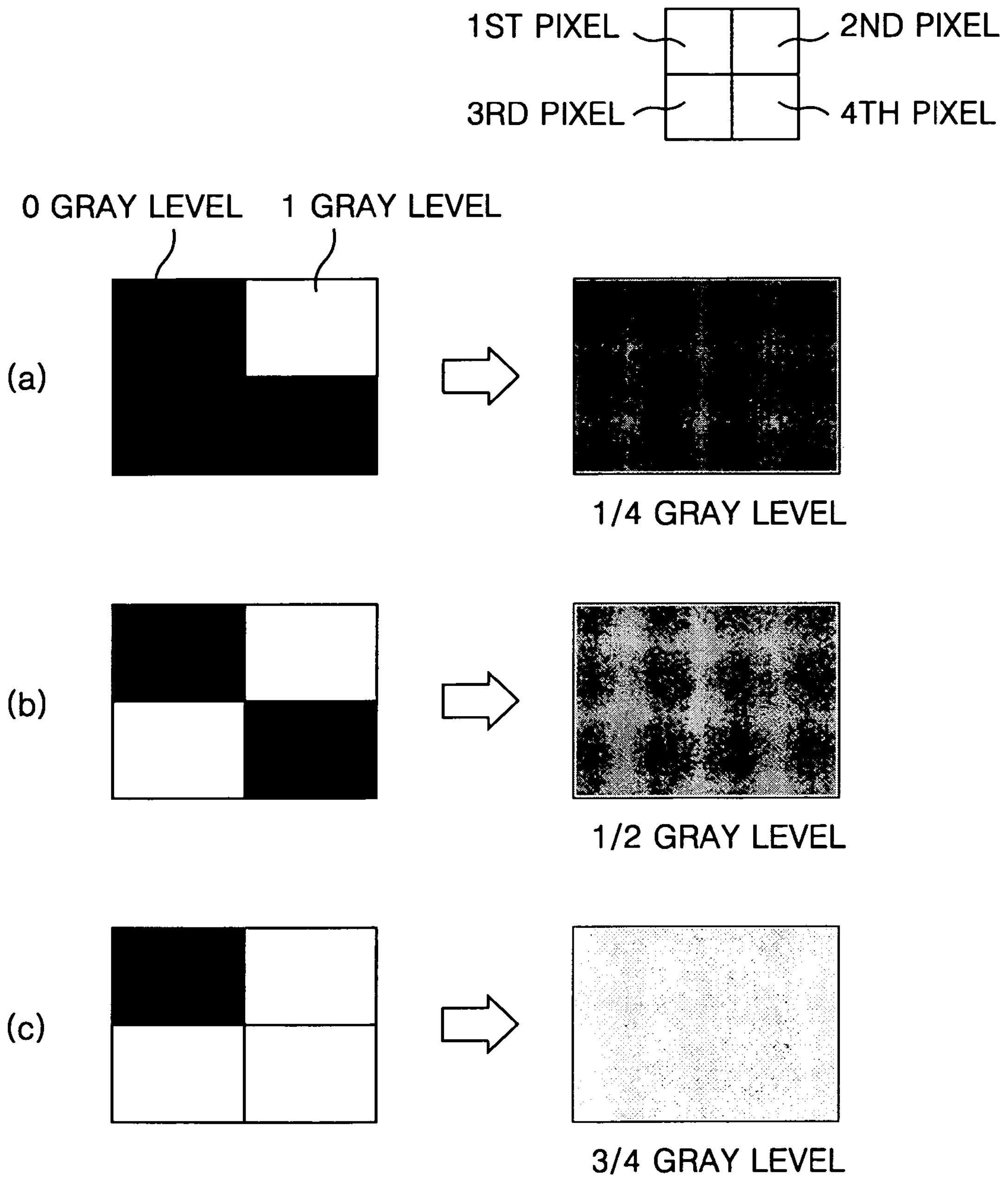
FIG. 7 illustrates an example of a dithering method.

In the dithering method, if the 0 gray level is displayed in three pixels among the four pixels that makes one pixel group and the 1 gray level is displayed in one pixel, as shown in (a) of FIG. 7, then an observer feels the ¼ gray level for the pixel group. In the same manner, the ½ gray level and the ¾ gray level are also expressed, as shown in (b) and (c) of FIG. 7.

Figure 8:
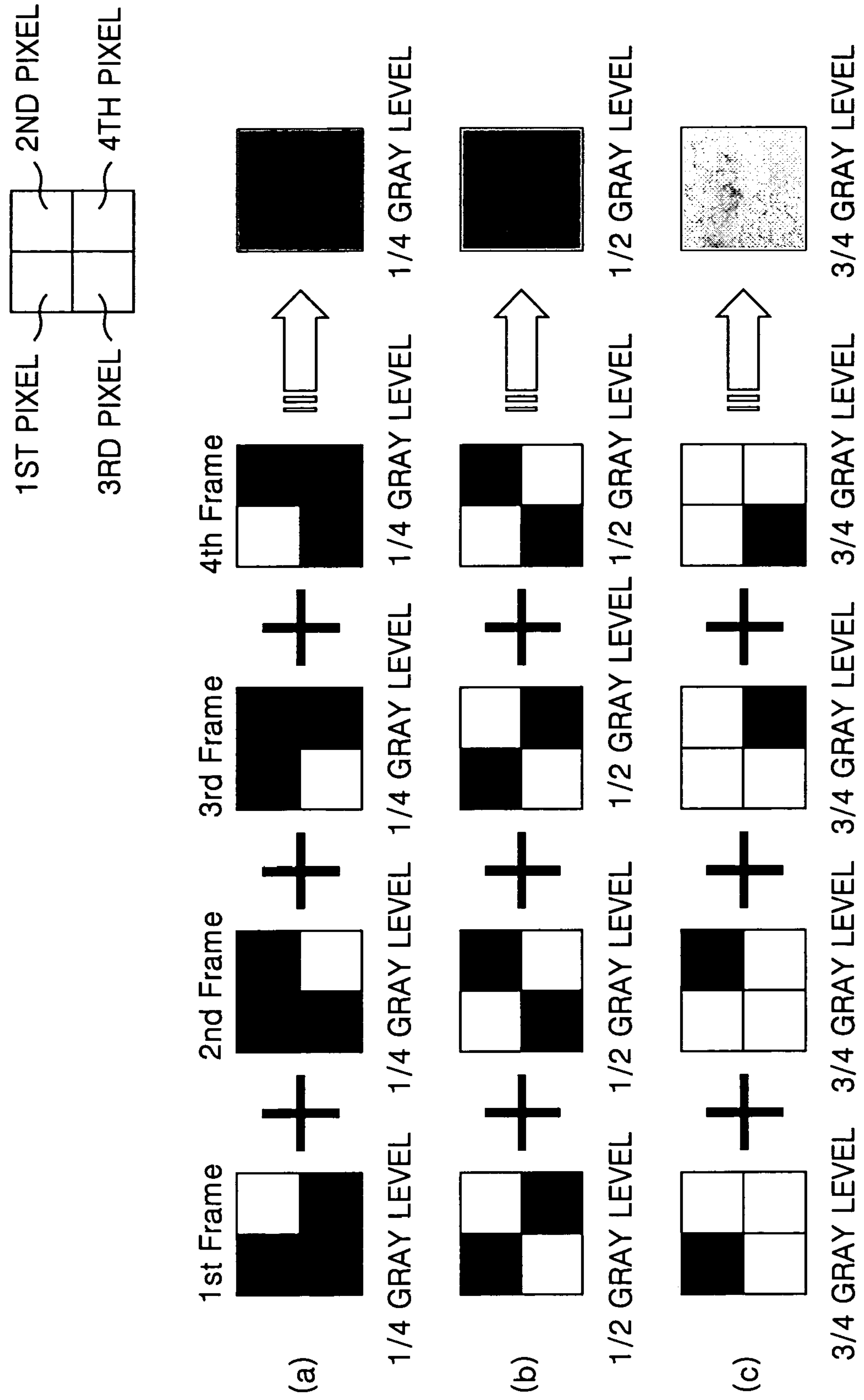
FIG. 8 illustrates an example of a mixed method of the frame rate control method and the dithering method.

As a method of using the frame rate control method and the dithering method together, FIG. 8 represents that an intermediate gray level is expressed by simultaneously that applies the dithering method that has four pixels as a group and the frame rate control method having four frames as a unit for the pixel group. In case of 4×4 frame rate control method and dithering method like this, as shown in (a) of FIG. 8, the gray level shown by the pixel group at each frame for four frames is the ¼ gray level, and each pixel (first to fourth pixels) that forms the pixel group represents the ¼ gray level by having the four frames as a unit. In the same manner, when expressing the ½ gray level, as shown in (b), each pixel group expresses the ½ gray level for each frame by the dithering method and each pixel expresses the ½ gray level over four frames. In the same manner, the ¾ gray level is expressed as shown in (c).

The controlling method that applies the frame rate control and the dithering together in this way is advantageous because it is possible to solve a flicker that is generated in the frame rate control method and a resolution deterioration that is generated in the dithering method.

The number of frames that form the frame group in the frame rate control method or the number of pixels that form the pixel group in the dithering method can be variously adjusted as occasion demands.

The picture quality controlling method of the flat panel display device compensates the brightness difference of the panel defect location by the picture controlling method, for example, the frame rate control method and the dithering method that can subdivide the hue or gray level that is expressed by the screen of the display device in accordance with the data process capacity of the display device, thereby being advantageous because it is possible to realize a natural and fine picture quality.

Figure 9:
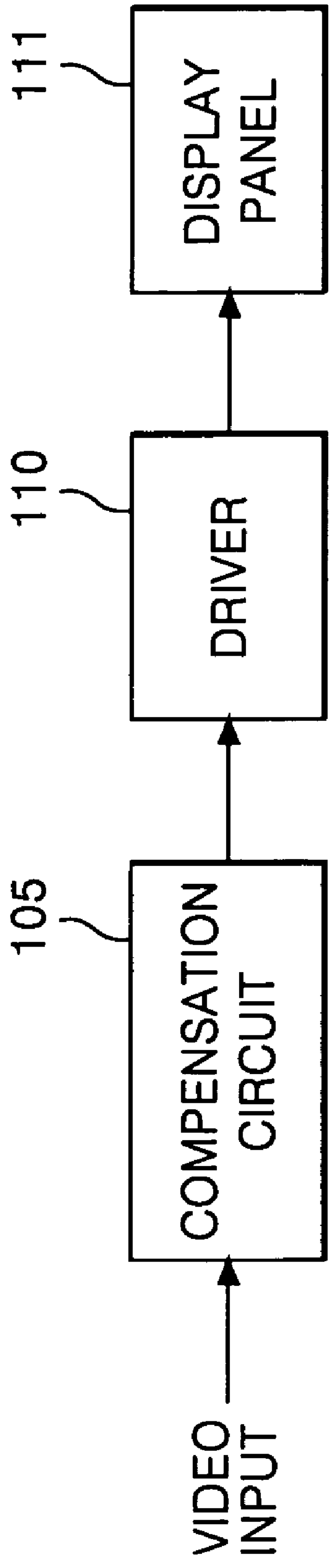
FIG. 9 is flowchart that illustrates a flat panel display device according to the present invention.

In the input signal correction act S3, the flat panel display device, as shown in FIG. 9, includes a compensating part 105 that receives video data and modulates the video data to supply to the driver 110 that drives the display panel 111.

Figure 10:
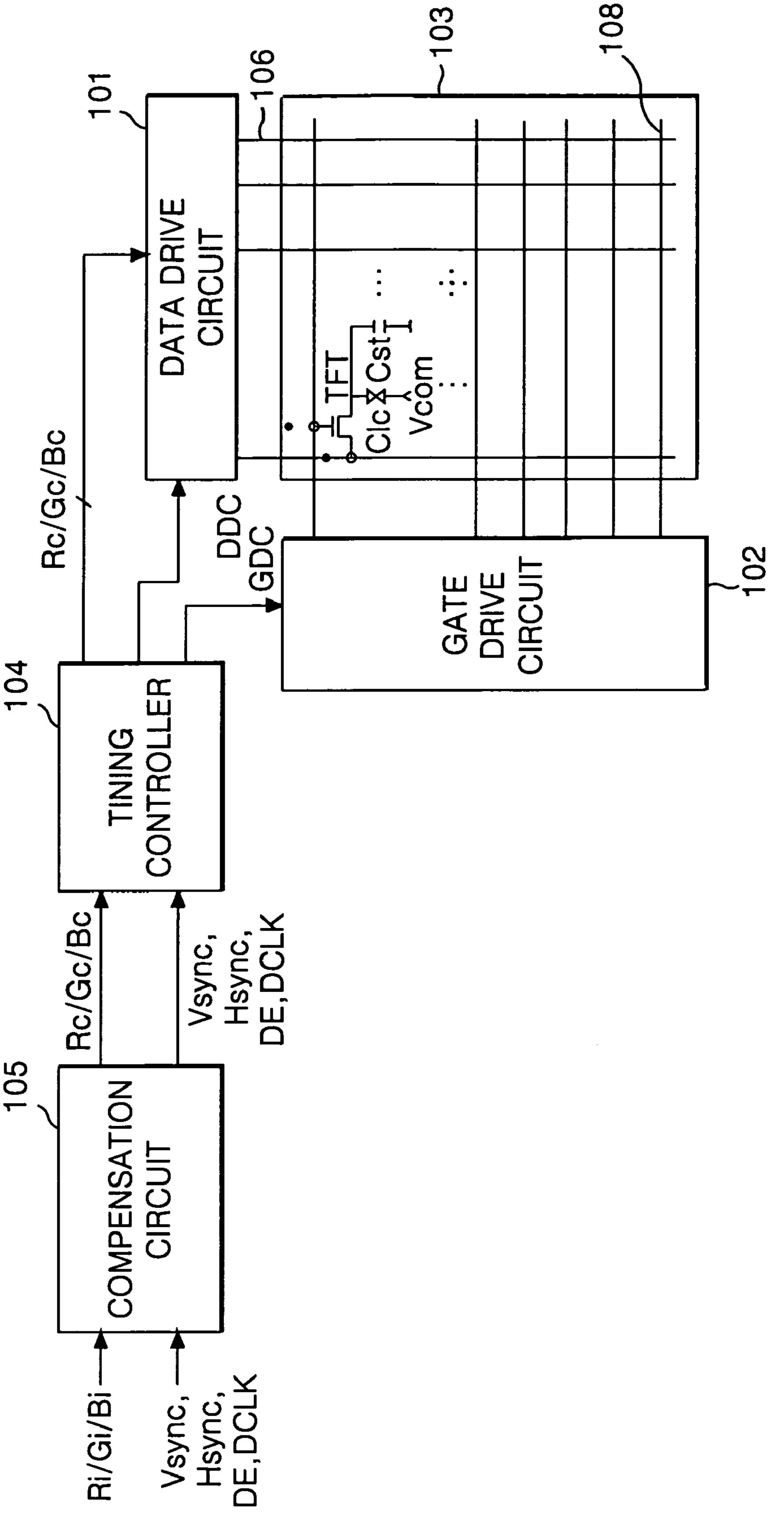
FIG. 10 is a view that illustrates a liquid crystal display device according to an embodiment.

As shown in FIG. 10, the liquid crystal display device according to the embodiment includes a liquid crystal display panel 103 where data lines 106 cross gate lines 108 and a TFT that drives a liquid crystal cell Clc is formed at each of the cross intersections. A compensating part 105 generates a corrected digital video data Rc/Gc/Bc. A data drive circuit 101 drives the data line 106 by use of the corrected digital video data Rc/Gc/Bc. A gate drive circuit 102 supplies a scan pulse to the gate lines 106. A timing controller 104 controls the data drive circuit 101 and the gate drive circuit 102.

The liquid crystal display panel 103 has liquid crystal molecules injected between two substrates, for example, the TFT substrate and color filter substrate. The data lines 106 and the gate lines 108 formed on the TFT substrate cross each other. The TFT formed at the crossing part of the data lines 106 and the gate lines 108 supplies an analog gamma compensation voltage supplied through the data line 106 to a pixel electrode of the liquid crystal cell Clc in response to a scan signal from the gate line 108. A black matrix, a color filter and a common electrode (not shown) are formed on the color filter substrate. One pixel on the liquid crystal display panel 103 includes an R sub-pixel, a G sub-pixel and a B sub-pixel. The common electrode formed in the color filter substrate can be formed in the TFT substrate in accordance with an electric field application method. Polarizers have vertical polarizing axes that are perpendicular to each other and are respectively adhered to the TFT substrate and the color filter substrate.

The compensating part 105 receives the input digital video data Ri/Gi/Bi from a system interface and modulates the input digital video data Ri/Gi/Bi that are to be supplied to the panel defect location, thereby generating the corrected digital video data Rc/Gc/Bc. A detail description for the compensating part 105 will be made later on.

The timing controller 104 generates a gate control signal GDC that controls the gate drive circuit 102 and a data control signal DDC that controls the data drive circuit 101 by use of a vertical/horizontal synchronization signal Vsync, Hsync, a data enable signal DE and a dot clock DCLK supplied through the compensating part 105, and supplies the corrected digital video data Rc/Gc/Bc to the data drive circuit 101 in accordance with dot clocks DCLK.

The data drive circuit 101 receives the corrected digital video data Rc/Gc/Bc, converts the digital video data Rc/Gc/Bc into the analog gamma compensation voltage, and supplies them to the data lines 106 of the liquid crystal display panel 103 under control of the timing controller 104.

The gate drive circuit 102 supplies a scan signal to the gate lines 108, thereby turning on the TFT's connected to the gate lines 108 to select the liquid crystal cells Clc of one horizontal line to which the analog gamma compensation voltage is to be supplied. The analog gamma compensation voltage generated from the data drive circuit 101 is synchronized with the scan pulse to be supplied to the liquid crystal cells Clc of the selected one horizontal line.

Figure 11:
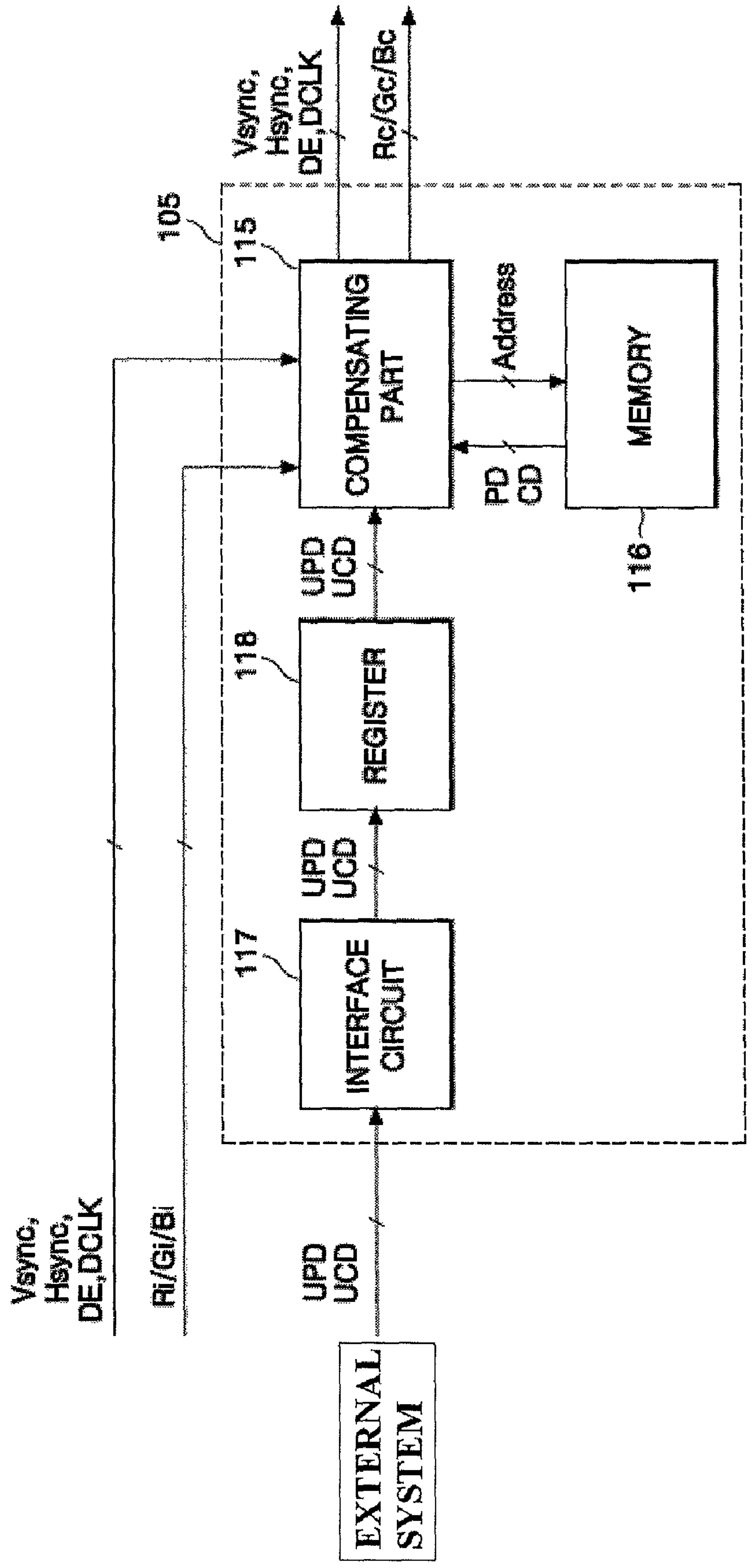
FIG. 11 is a view that illustrates a compensation circuit of FIG. 10.

As shown in FIG. 11, the compensating part 105 includes a memory 116 at which a compensation value and a location information of a panel defect location on a liquid crystal display panel 103 are stored. A compensating part 115 that generates the corrected digital video data Rc,Gc,Bc by modulating the input video digital data Ri/Gi/Bi that are to be displayed at the panel defect location by use of the compensation value. An interface circuit 117 communicates between the compensating part 105 and an external system. A register 118 temporarily stores the data to be displayed at the memory 116 through the interface circuit 117.

The data for the compensation value in accordance with the gray level of the input digital video data Ri/Gi/Bi for each location of the panel defects are stored at the memory 116 along with the location information of the panel defect. The compensation value according to the gray level is a compensation value determined in correspondence to each gray level of the input digital video data Ri/Gi/Bi or a compensation value determined in correspondence to the gray level section which includes two or more gray levels. When setting the compensation value in correspondence to the gray level section, information for the gray level section, for example, information of the gray level included in the gray level section, is also stored at the memory 116. The memory 116 may include an EEPROM (electrically erasable programmable read only memory) with which the data for the compensation value and location of the panel defect can be renewed by the electrical signal from the external system.

It is possible to use EDI ROM (extended display identification data ROM) instead of EEFROM as the memory 116. The EDI ROM stores, for example, the panel defect compensation related data at a separate storage space, and stores seller/manufacturer identification information and variables, characteristics of a basic display device as a monitor information data other than the compensation related data. When storing the panel defect compensation data at the EDID ROM instead of the EEPROM, a ROM recorder (not shown) transfers the panel defect compensation data through a DDC (data display channel). The memory at which the panel defect compensation data is stored will be explained assuming that it is an EEPROM.

The interface circuit 117 is a configuration that communicates between the compensating part 105 and the external system, and the interface circuit 117 is designed, for example, according to the communication standard protocol such as I2C. The external system can read the data stored at the memory 116 through the interface circuit 117 or modify the data. The data for the compensation value CD and the pixel location PD stored at the memory 116 are required to be renewed by reasons such as change in process, difference between application model, and a user supplies the data for the compensation value UCD and the pixel location UPD, which are desired to be renewed, from the external system so that the data stored at the memory 116 can be modified.

The pixel location UPD and compensation value UCD data transmitted through the interface circuit 117 are temporarily stored at the register 118 in order to renew the pixel location PD and the compensation value CD stored at the memory 116.

Figure 12:
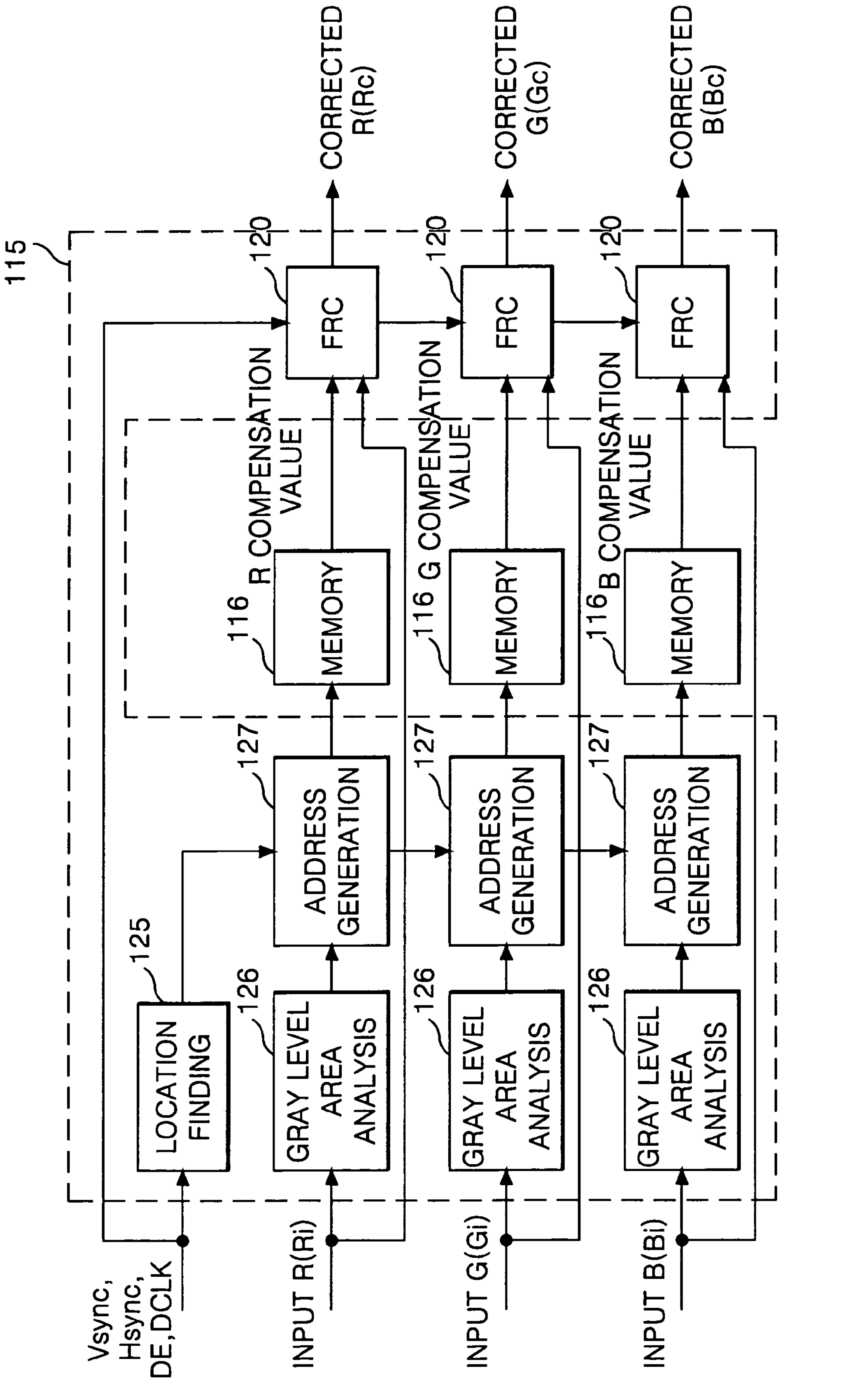
FIG. 12 is a view that illustrates a first embodiment for a compensating part of FIG. 11.
Figure 13:
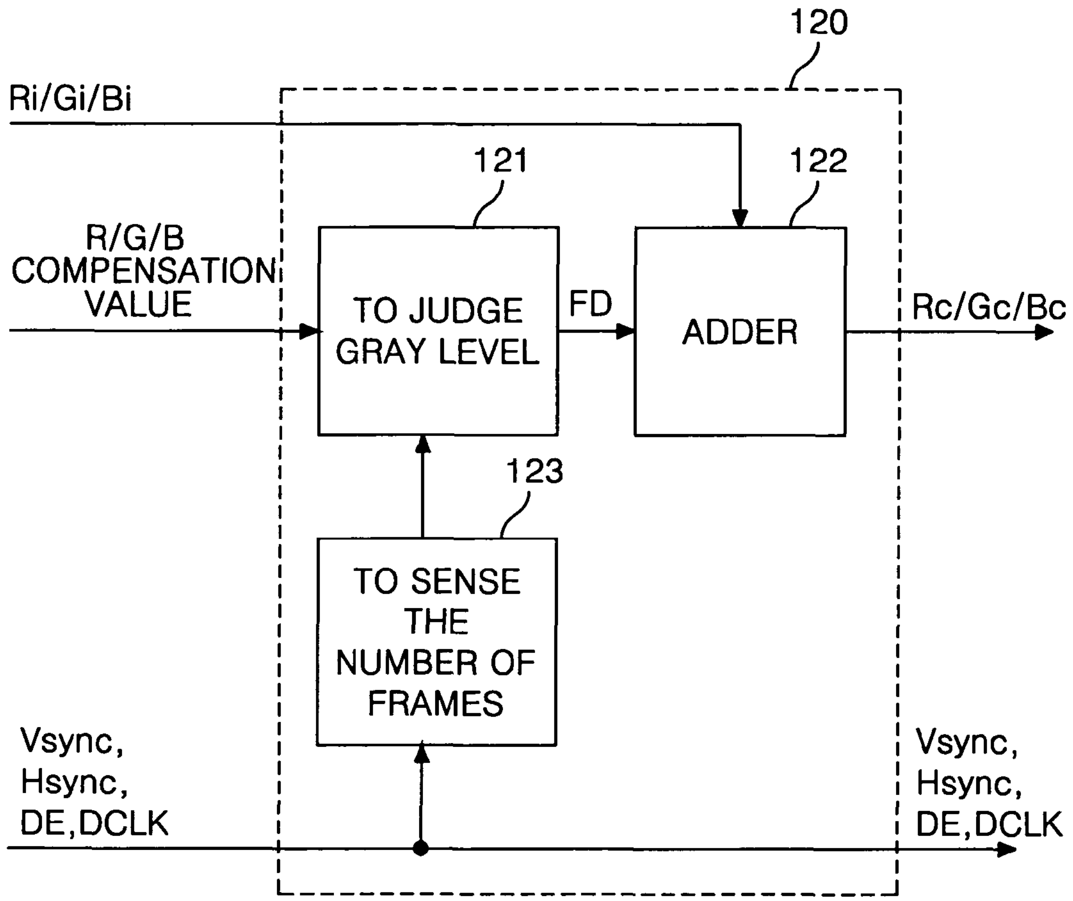
FIG. 13 is a flow chart that illustrates a frame rate control part of FIG. 12.

As shown in FIGS. 11, 12 and 13, the compensating part 115 according to the first embodiment of the present invention judges the location of the input digital video data Ri/Gi/Bi on the liquid crystal display panel 103 and disperses the compensation value from the memory to a plurality of frames by use of the frame rate control method if the location of the input digital video data Ri/Gi/Bi is included in the panel defect location, in accordance with the vertical/horizontal synchronization signal Vsync, Hsync, the dot clock DCLK and the data enable signal DE.

The compensating part 115 includes a location finding part 125 that judges the location of the input digital video data Ri/Gi/Bi by use of anyone or more of the vertical/horizontal synchronization signal Vsync, Hsync, the dot clock DCLK and the data enable signal DE. A gray level analyzing part 126 analyzes the gray level area of the input digital video data Ri/Gi/Bi. An address generating part 127 generates a read address that is for access to the memory 116 by use of the gray level information and the location of the input digital video data Ri/Gi/Bi supplied from the location judging part 125 and the gray level analyzing part 126. A frame rate controlling part 120 that disperses the compensation value (R compensation value, G compensation value, B compensation value) loaded from the memory 116 to a plurality of frames by the frame rate control method.

The location finding part 125 judges the display location of the input digital video data Ri/Gi/Bi by use of any one or more of the vertical/horizontal synchronization signal Vsync, Hsync, the dot clock DCLK and the data enable signal DE. For example, it is possible to find the location that is to be displayed on the liquid crystal display panel 103 of the input digital video data Ri/Gi/Bi by counting the horizontal synchronization signal Hsync and the dot clock DCLK.

The gray level analyzing part 126 analyzes the gray level area of the input digital video data Ri/Gi/Bi. That is to say, an analysis is made for the gray level of the input digital video data Ri/Gi/Bi or the gray level section inclusive of the gray level.

The address generating part 127 receives the location information of the input digital video data Ri/Gi/Bi from the location finding part 125 and the gray level information of the input digital video data Ri/Gi/Bi from the gray level analyzing part 126 to generate a read address that accesses an address of the memory 116 at which the compensation value (R compensation value, G compensation value, B compensation value) corresponding to the location and gray level of the input digital video data Ri/Gi/Bi is stored.

The frame rate controlling part 120 disperses the compensation value (R compensation value, G compensation value, B compensation value), which is loaded from the address of the memory 116 corresponding to the read address generated by the address generating part 127, to a plurality of frames by the frame rate control method.

The frame rate controlling part 120 includes a frame number sensing part 123 that senses the number of frames by use of anyone of the vertical/horizontal synchronization signal Vsync, Hsync, the dot clock DCLK and the data enable signal DE. A gray-level judging part 121 which judges the level of the gray level of the compensation value (R/G/B compensation value) and generates frame rate control data FD by use of a frame information from the frame number sensing part 123. An operator 122 that generates the corrected digital video data Rc/Gc/Bc by increasing or decreasing the input digital video data Ri/Gi/Bi with the frame rate control data FD.

The frame number sensing part 123 senses the number of frames by use of any one or more of the vertical/horizontal synchronization signal Vsync, Hsync, the dot clock DCLK and the data enable signal DE. For example, the number of frames can be sensed by counting the vertical synchronization signal Vsync.

The gray-level judging part 121 judges the level of the gray level of the compensation value (R/G/B compensation value) and generates the frame rate control data FD by use of the frame information from the frame sensing part 123. For example, in case that the binary data of '01' as the compensation value (R/G/B compensation value) is supplied to the gray-level judging part 121, the gray-level level judging part 121 judges to what extent the binary data of '01' compensates the gray level to the input digital video data Ri/Gi/Bi which are to be supplied to the panel defect location. When the compensation value (R/G/B compensation value) is '01', this means that the R compensation value, the G compensation value and the B compensation value each are equally '01'. If the gray-level judging part 121 is controlled by the frame rate control method having four frames as a frame group, and it is pre-determined for '00' to be recognized as the compensation value for 0 gray level, for '01' to be recognized as the compensation value for ¼ gray level, for '10' to be recognized as the compensation value for ½ gray level and for '11' to be recognized as the compensation value for ¾ gray level, the gray-level judging part 121 judges the binary data of '01' as the compensation value for compensating the ¼ gray level for the input digital video data Ri/Gi/Bi that are to be supplied to the panel defect location. If the level of the gray level is judged in this way, the gray-level 1 judging part 121 determines to what frame the data of '01' is dispersed among the four frames composing the frame group by the frame rate control method in order to compensate for the ¼ gray level to the input digital video data Ri/Gi/Bi that are to be supplied to the panel defect location.

Figure 6:
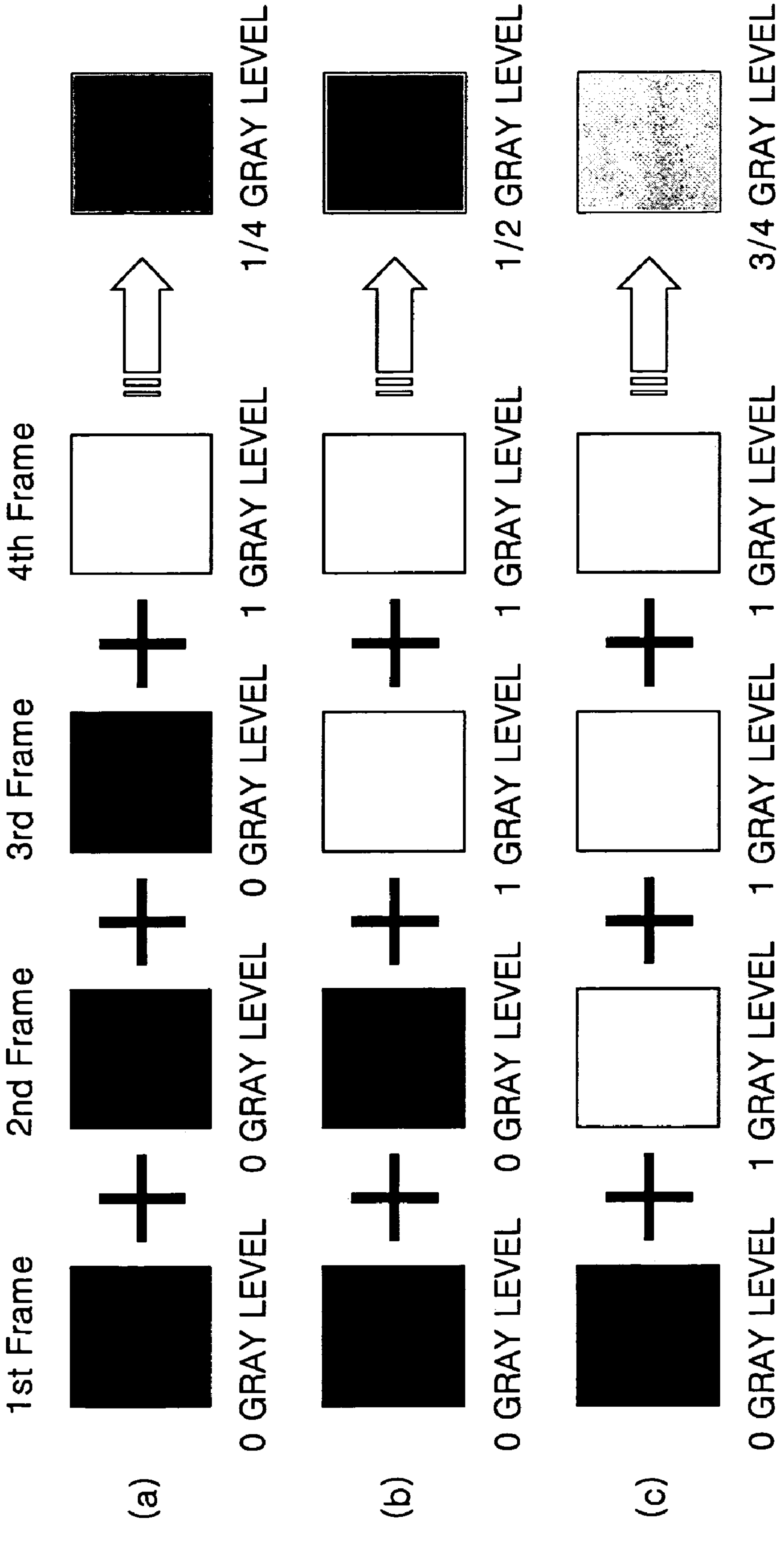
FIG. 6 illustrates an example of a frame rate control method.

As shown in (a) of FIG. 6, the gray-level judging part 121 generates a frame rate control data FD that disperse the data of '01' to the four frames forming the group so that one gray level is compensated in any one frame of the first to fourth frames. For example, the gray-level judging part 121 generates the frame rate control data FD such as '0' (0 gray level compensation) to the first frame, '0' (0 gray level compensation) to the second frame, '0' (0 gray level compensation) to the third frame, and '1' (1 gray level compensation) to the fourth frame.

The compensation value (R/G/B compensation value) can be determined as a value that compensates 1 or more gray levels for the input digital video data Ri/Gi/Bi that are to be supplied to the panel defect location. The compensation value (R/G/B compensation value) includes an integral part and a fractional part. For example, the compensation value (R/G/B compensation value) that compensates a 3.25 gray level that includes the integral part '3.00' and the fractional part '0.25', and '0.25 (¼)' among these can be expressed as the binary data of '01' as in the above and '3.00' can be expressed as '11' is the binary data of 2 bits. Such an integral part can be expressed as the number of various bits in accordance with the threshold value of the compensation value (R/G/B compensation value). When '3.00' is expressed as '11' and '0.25' is expressed as '01', the compensation value (R/G/B compensation value) can be expressed as the data of 4 bits like '1101' by having upper 2 bits as the integral part and lower 2 bits as the fractional part. In case that the binary data of '1101' like this are supplied to the gray-level level judging part 121, the gray-level level judging part 121 judges the binary data of '1101' as the compensation value (R/G/B compensation value) for compensating '3.25' gray level for the input digital video data Ri/Gi/Bi that are to be displayed to the panel defect location, and generates the frame rate control data FD for dispersing the data of '1101' to the four frames forming the group. For example, the gray-level judging part 121 generates the frame rate control data FD such as '1100' in the first frame, '1100' in the second frame, '1100' in the third frame and '1101' in the fourth frame.

The operator 122 increases or decreases the input digital video data Ri/Gi/Bi with the frame rate control data FD to generate the corrected digital video data Rc/Gc/Bc.

The liquid crystal display device according to the embodiment of the present invention includes the compensating part 105 that is controlled by the frame rate control method and can express the subdivided gray level and color difference. When the liquid crystal display device that is driven with the digital video data where the R,G,B data each are 8 bits and where 256 gray levels can be expressed for each of the R, G, B, the liquid crystal display device includes the compensating part 105 controlled by the frame rate control method having the four frames as a frame group, thereby subdividing the expressible gray level into 1021 gray levels for each of R,G,B. The liquid crystal display device according to the embodiment of the present invention corrects the brightness difference of the non-defect location and the panel defect location with the subdivided gray level, thereby enabling the device to realize the natural and find picture quality.

Figure 14:
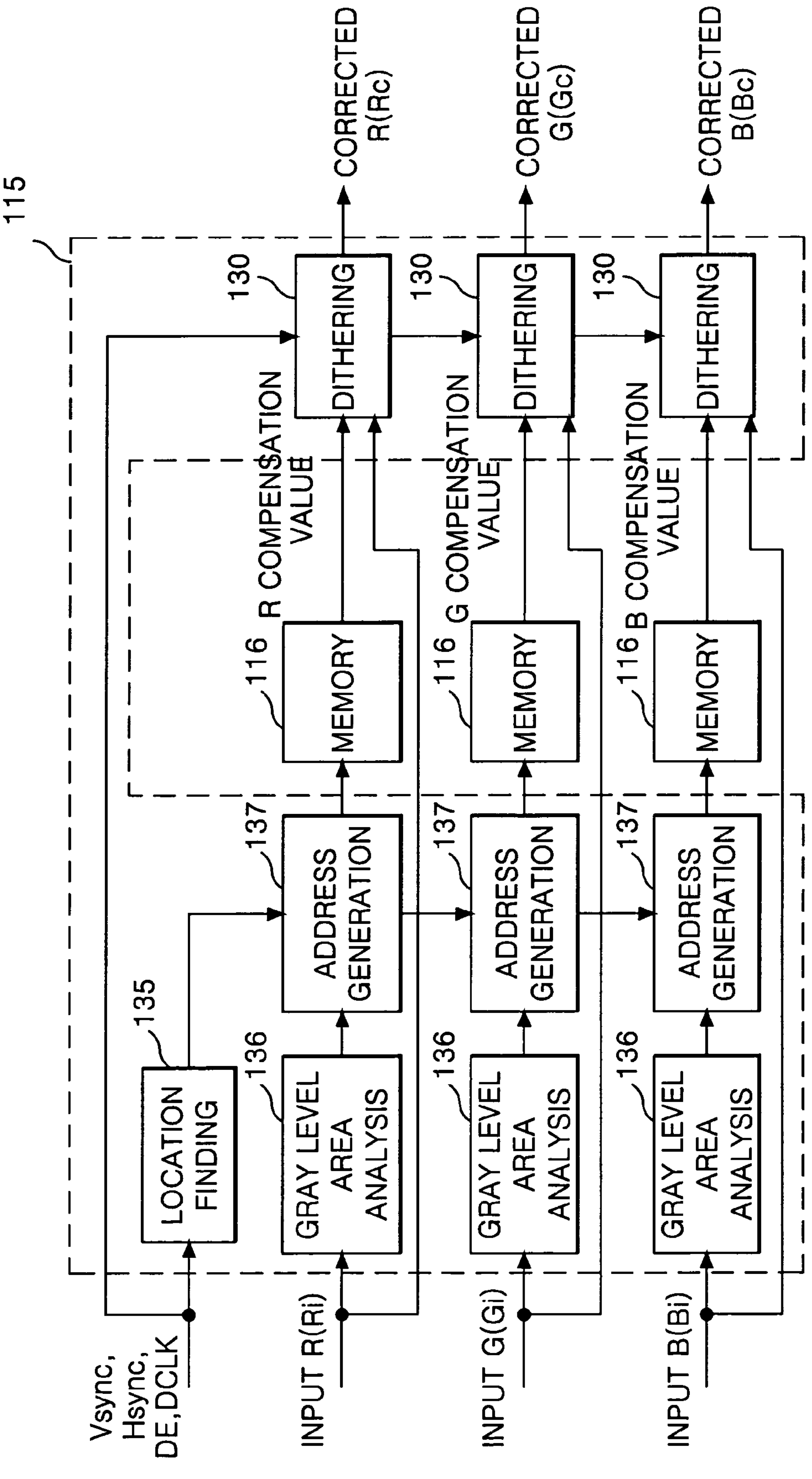
FIG. 14 is a flow chart that illustrates a second embodiment for the compensating part of FIG. 11.
Figure 15:
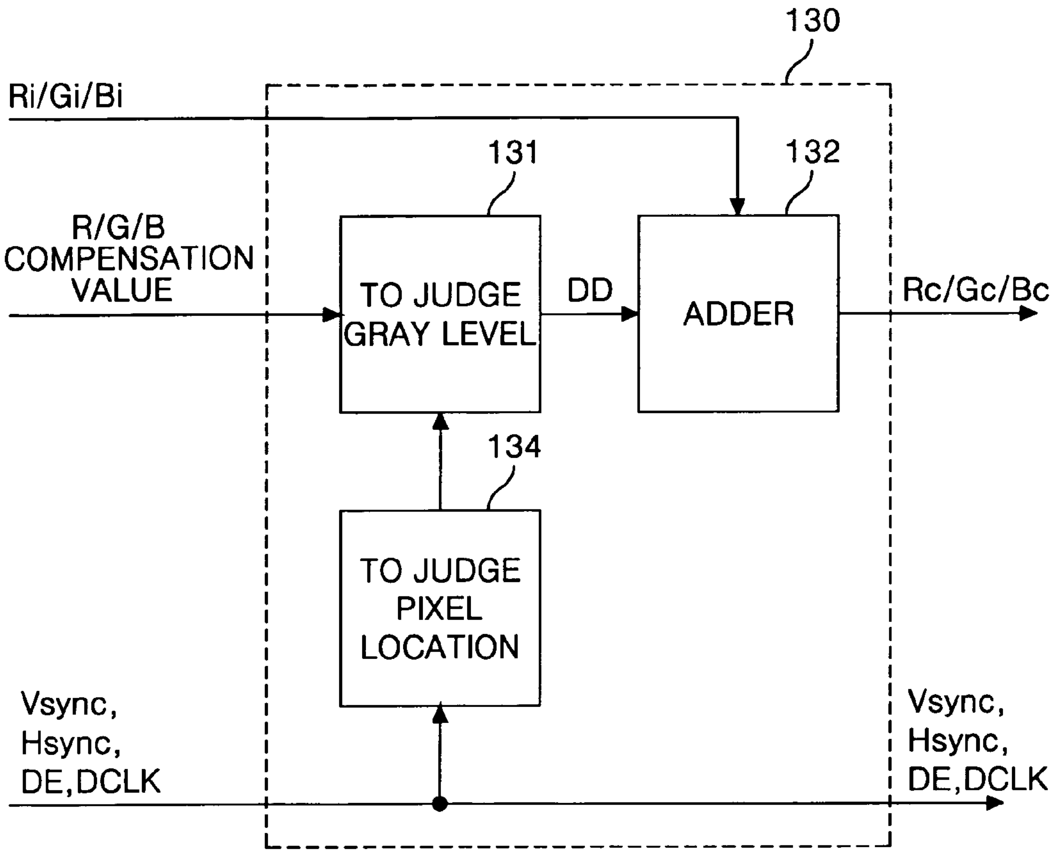
FIG. 15 is a view representing a dithering part of FIG. 14.

Referring to FIGS. 11, 14 and 15, the compensating part 115 according to the second embodiment judges the location of the input digital video data Ri/Gi/Bi on the liquid crystal display panel 103 and disperses the compensation value from the memory 116 to a plurality of pixels that are adjacent to the pixel where the input digital video data Ri/Gi/Bi are to be displayed by use of the dithering method if the location of the input digital video data Ri/Gi/Bi is included in the panel defect location, in accordance with the vertical/horizontal synchronization signal Vsync, Hsync, the dot clock DCLK and the data enable signal DE.

The compensating part 115 includes a location judging part 135 that finds the location of the input digital video data Ri/Gi/Bi by use of anyone or more of the vertical/horizontal synchronization signal Vsync, Hsync, the dot clock DCLK and the data enable signal DE. A gray level analyzing part 136 analyzes the gray level area of the input digital video data Ri/Gi/Bi. An address generating part 137 generates a read address that accesses the memory 116 by use of the gray level information and the location of the input digital video data Ri/Gi/Bi supplied from the location judging part 135 and the gray level analyzing part 136. A dithering part 130 disperses the compensation value (R compensation value, G compensation value, B compensation value) loaded from the memory 116 to a plurality of pixels by the dithering method.

The location judging part 135 finds the display location of the input digital video data Ri/Gi/Bi by use of any one or more of the vertical/horizontal synchronization signal Vsync, Hsync, the dot clock DCLK and the data enable signal DE. For example, it is possible to find the location that is to be displayed on the liquid crystal display panel 103 of the input digital video data Ri/Gi/Bi by counting the horizontal synchronization signal Hsync and the dot clock DCLK.

The gray level analyzing part 136 analyzes the gray level area of the input digital video data Ri/Gi/Bi. That is to say, an analysis is made for the gray level of the input digital video data Ri/Gi/Bi or the gray level section inclusive of the gray level.

The address generating part 137 receives the location information of the input digital video data Ri/Gi/Bi from the location judging part 135 and the gray level information of the input digital video data Ri/Gi/Bi from the gray level analyzing part 136 to generate a read address which is for accessing an address of the memory 116 at which the compensation value (R compensation value, G compensation value, B compensation value) corresponds to the location and gray level of the input digital video data Ri/Gi/Bi is stored.

The dithering part 130 disperses the compensation value (R compensation value, G compensation value, B compensation value), which is loaded from the address of the memory 116 corresponding to the read address generated by the address generating part 137, by the dithering method to a plurality of pixels which are adjacent to the pixel where the input digital video data Ri/Gi/Bi are to be displayed.

The dithering part 130 includes a pixel location judging part 134 for judging a pixel location by use of any one of the vertical/horizontal synchronization signal Vsync, Hsync, the dot clock DCLK and the data enable signal DE; a gray-level level judging part 131 that judges the level of the gray level of the compensation value (R/G/B compensation value) and generates dithering data DD by use of a pixel location information from the pixel location judging part 134. An operator 132 generates the corrected digital video data Rc/Gc/Bc by increasing or decreasing the input digital video data Ri/Gi/Bi with the dithering data DD.

The pixel location judging part 134 judges the pixel location by use of any one or more of the vertical/horizontal synchronization signal Vsync, Hsync, the dot clock DCLK and the data enable signal DE. For example, the pixel location can be judged by counting the horizontal synchronization signal Hsync and the dot clock DCLK.

The gray-level level judging part 131 judges the level of the gray level of the compensation value (R/G/B compensation value) and generates the dithering data DD by use of the pixel location information from the pixel location judging part 134. For example, in case that the binary data of '01' as the compensation value (R/G/B compensation value) is supplied to the gray-level level judging part 131, the gray-level level judging part 131 judges to what extent the binary data of '01' compensates the gray level to the input digital video data Ri/Gi/Bi which are to be supplied to the panel defect location.

When the compensation value (R/G/B compensation value) is '01', this means that the R compensation value, the G compensation value and the B compensation value each are equally '01'. If the gray-level level judging part 131 is controlled by the dithering method having four pixels as a pixel group, and it is pre-determined for '00' to be recognized as the compensation value for 0 gray level, for '01' to be recognized as the compensation value for ¼ gray level, for '10' to be recognized as the compensation value for ½ gray level and for '11' to be recognized as the compensation value for ¾ gray level, the gray-level level judging part 131 judges the binary data of '01' as the compensation value for compensating the ¼ gray level for the input digital video data Ri/Gi/Bi which are to be supplied to the panel defect location. If the level of the gray level is judged in this way, the gray-level level judging part 131 determines to what pixel the data of '01' is dispersed among the four pixels composing the pixel group by the dithering method in order to compensate the ¼ gray level to the input digital video data Ri/Gi/Bi which are to be supplied to the panel defect location. The gray-level level judging part 131, as shown in (a) of FIG. 7, generates a dithering data DD for dispersing the data of '01' to the pixels forming the group so that one gray level is compensated in any one pixel of the first to fourth pixels. For example, the gray-level level judging part 131 generates the dithering data DD such as '0' (0 gray level compensation) to the first pixel, '1' (1 gray level compensation) to the second pixel, '0' (0 gray level compensation) to the third pixel, and '0' (0 gray level compensation) to the fourth pixel.

The compensation value (R/G/B compensation value) can be determined as a value that compensates for 1 or more gray levels for the input digital video data Ri/Gi/Bi which are to be supplied to the panel defect location. The compensation value (R/G/B compensation value) includes an integral part and a fractional part. For example, the compensation value (R/G/B compensation value) that compensates for a 3.25 gray level includes the integral part '3.00' and the fractional part '0.25', and '0.25 (¼)' among these can be expressed as the binary data of '01' as in the above and '3.00' can be expressed as '11' is the binary data of 2 bits. Such an integral part can be expressed as the number of various bits in accordance with the threshold value of the compensation value (R/G/B compensation value). When '3.00' is expressed as '11' and '0.25' is expressed as '01', the compensation value (R/G/B compensation value) can be expressed as the data of 4 bits like '1101' by having upper 2 bits as the integral part and lower 2 bits as the fractional part. In case that the binary data of '1101' like this are supplied to the gray-level level judging part 131, the gray-level level judging part 131 judges the binary data of '1101' as the compensation value (R/G/B compensation value) that compensates for '3.25' gray level for the input digital video data Ri/Gi/Bi that are to be displayed to the panel defect location, and generates the dithering data DD for dispersing the data of '1101' to the four pixels forming the group. For example, the gray-level level judging part 131 generates the dithering data DD such as '1100' in the first pixel, '1101' in the second pixel, '1100' in the third pixel and '1100' in the fourth pixel.

The operator 132 increases or decreases the input digital video data Ri/Gi/Bi with the dithering data DD to generate the corrected digital video data Rc/Gc/Bc.

The liquid crystal display device according to the embodiment of the present invention includes the compensating part 105 that is controlled by the dithering method and can express the subdivided gray level and color difference. For example, when the liquid crystal display device that is driven with the digital video data where the R,G,B data each are 8 bits and where 256 gray levels can be expressed for each of the R, G, B, the liquid crystal display device includes the compensating part 105 controlled by the dithering method having the four pixels as a pixel group, thereby subdividing the expressible gray level into 1021 gray levels for each of R,G,B. The liquid crystal display device according to the embodiment of the present invention corrects the brightness difference of the non-defect location and the panel defect location with the subdivided gray level, thereby enabling the device to realize the natural and find picture quality.

Figure 16:
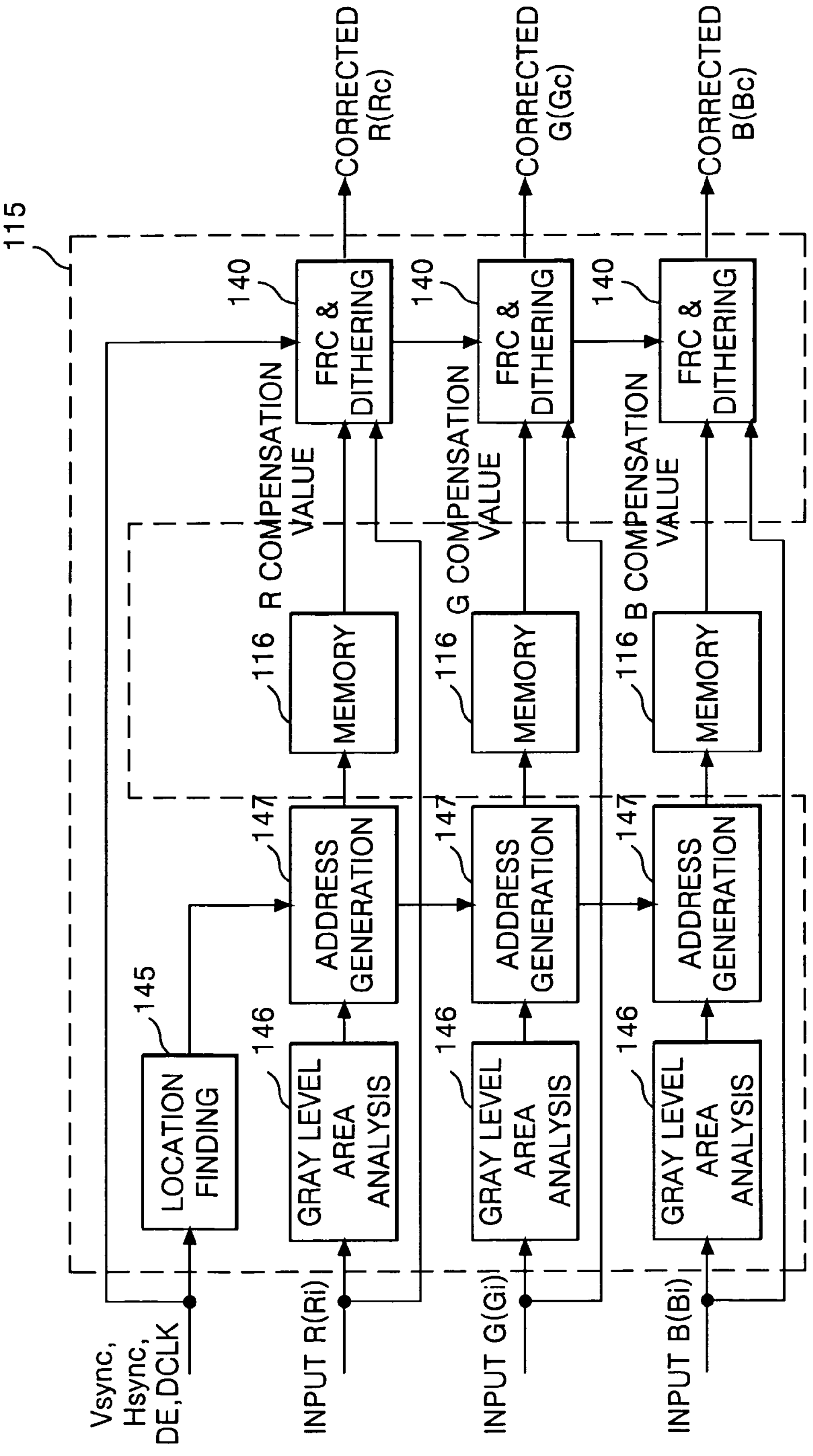
FIG. 16 is a view that illustrates a third embodiment for the compensating part of FIG. 11.
Figure 17:
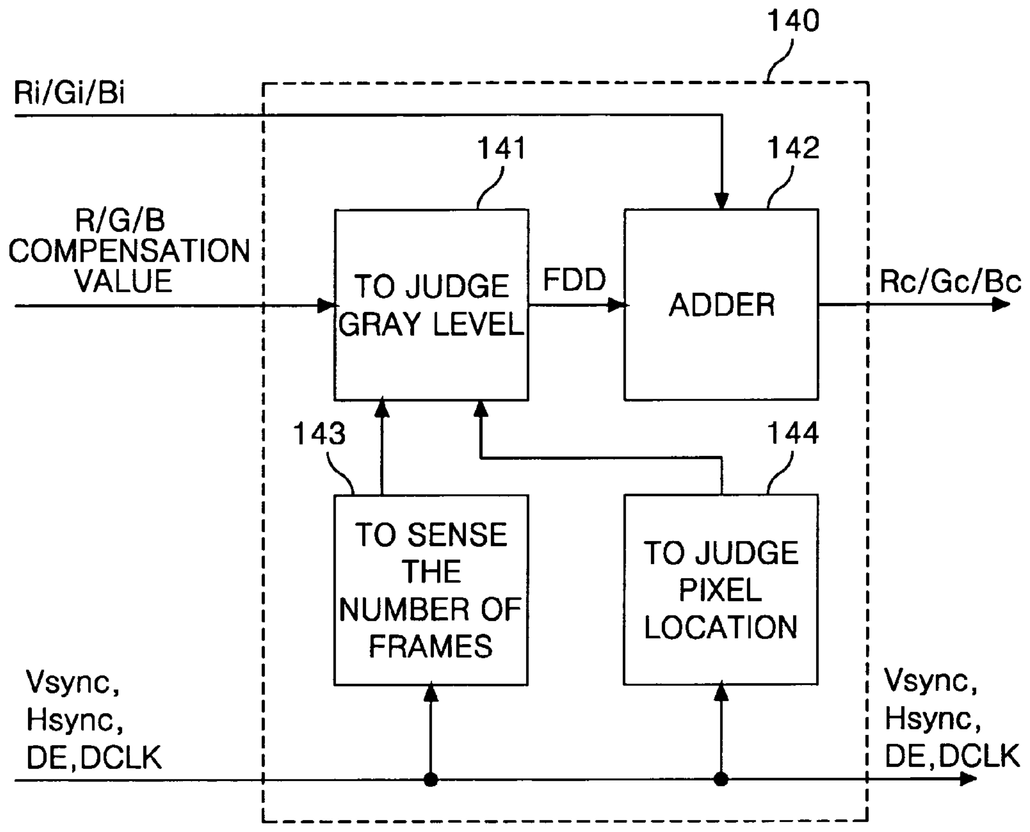
FIG. 17 is a view that illustrates a frame rate control part and a dithering part of FIG. 16.

Referring to FIGS. 11, 16 and 17, the compensating part 105 according to the third embodiment finds the location of the input digital video data Ri/Gi/Bi on the liquid crystal display panel 103, and disperses the compensation value from the memory 116 to a plurality of frames by use of the frame rate control method and disperses the compensation value from the memory 116 to a plurality of adjacent pixels by use of the dithering method if the location of the input digital video data Ri/Gi/Bi is included in the panel defect location, in accordance with the vertical/horizontal synchronization signal Vsync, Hsync, the dot clock DCLK and the data enable signal DE.

The compensating part 115 includes a location judging part 145 that judges the location of the input digital video data Ri/Gi/Bi by use of any one or more of the vertical/horizontal synchronization signal Vsync, Hsync, the dot clock DCLK and the data enable signal DE. A gray level analyzing part 146 that analyzes the gray level area of the input digital video data Ri/Gi/Bi. An address generating part 147 that generates a read address that accesses the memory 116 by use of the gray level information and the location of the input digital video data Ri/Gi/Bi supplied from the location judging part 145 and the gray level analyzing part 146. A frame rate controlling and dithering part 140 that disperses the compensation value (R compensation value, G compensation value, B compensation value) loaded from the memory 116 to a plurality of frames by the frame rate control method and disperses to the pixels that are adjacent to the pixel where the input digital video data Ri/Gi/Bi are to be displayed by the dithering method.

The location judging part 145 finds the display location of the input digital video data Ri/Gi/Bi by use of any one or more of the vertical/horizontal synchronization signal Vsync, Hsync, the dot clock DCLK and the data enable signal DE. For example, it is possible to judge the location which is to be displayed on the liquid crystal display panel 103 of the input digital video data Ri/Gi/Bi by counting the horizontal synchronization signal Hsync and the dot clock DCLK.

The gray level analyzing part 146 analyzes the gray level area of the input digital video data Ri/Gi/Bi. That is to say, an analysis is made for the gray level of the input digital video data Ri/Gi/Bi or the gray level section inclusive of the gray level.

The address generating part 147 receives the location information of the input digital video data Ri/Gi/Bi from the location judging part 145 and the gray level information of the input digital video data Ri/Gi/Bi from the gray level analyzing part 146 to generate a read address which accesses an address of the memory 116 at which the compensation value (R compensation value, G compensation value, B compensation value) that corresponds to the location and gray level of the input digital video data Ri/Gi/Bi is stored.

The frame rate controlling and dithering part 140 disperses the compensation value (R compensation value, G compensation value, B compensation value), which is loaded from the address of the memory 116 corresponding to the read address generated by the address generating part 147, to a plurality of frames by the frame rate control method and to the pixels adjacent to the pixel where the input digital video data Ri/Gi/Bi are to be displayed by the dithering method.

The frame rate controlling and dithering part 140 includes a frame number sensing part 143 that senses the number of frames by use of any one of the vertical/horizontal synchronization signal Vsync, Hsync, the dot clock DCLK and the data enable signal DE. A pixel location judging part 144 that judges the pixel location by use of any one of the vertical/horizontal synchronization signal Vsync, Hsync, the dot clock DCLK and the data enable signal DE. A gray-level level judging part 141 that judges the level of the gray level of the compensation value (R/G/B compensation value) and generates frame rate control and dithering data FDD by use of a frame number information from the frame number sensing part 143 and a pixel location information from the pixel location judging part 144. An operator 142 generates the corrected digital video data Rc/Gc/Bc by increasing or decreasing the input digital video data Ri/Gi/Bi with the frame rate control and dithering data FDD.

The frame number sensing part 143 senses the number of frames by use of any one or more of the vertical/horizontal synchronization signal Vsync, Hsync, the dot clock DCLK and the data enable signal DE. For example, the number of frames can be sensed by counting the vertical synchronization signal Vsync.

The pixel location judging part 144 judges the pixel location by use of any one or more of the vertical/horizontal synchronization signal Vsync, Hsync, the dot clock DCLK and the data enable signal DE. For example, the pixel location can be judged by counting the horizontal synchronization signal Hsync and the dot clock DCLK.

The gray-level level judging part 141 judges the level of the gray level of the compensation value (R/G/B compensation value) and generates the frame rate control and dithering data FDD by use of the frame information from the frame sensing part 143 and the pixel location information from the pixel location judging part 144. For example, in case that the binary data of '01' as the compensation value (R/G/B compensation value) is supplied to the gray-level level judging part 141, the gray-level level judging part 141 judges to what extent the binary data of '01' compensates the gray level to the input digital video data Ri/Gi/Bi that are to be supplied to the panel defect location. When the compensation value (R/G/B compensation value) is '01', this means that the R compensation value, the G compensation value and the B compensation value each are equally '01'. If the gray-level level judging part 141 is controlled by the frame rate control and dithering method having four frames as a frame group and four pixels as a pixel group, for example, 4×4 frame rate control and dithering method, and it is pre-determined for '00' to be recognized as the compensation value for 0 gray level, for '01' to be recognized as the compensation value for ¼ gray level, for '10' to be recognized as the compensation value for ½ gray level and for '11' to be recognized as the compensation value for ¾ gray level, the gray-level level judging part 141 judges the binary data of '01' as the compensation value that compensates the ¼ gray level for the input digital video data Ri/Gi/Bi that are to be supplied to the panel defect location. If the level of the gray level is judged in this way, the gray-level level judging part 141 determines to what frame the data of '01' is dispersed among the four frames composing the frame group by the frame rate control method and to what pixel the data of '01' is dispersed among the four pixels composing the pixel group by the dithering method in order to compensate the ¼ gray level to the input digital video data Ri/Gi/Bi which are to be supplied to the panel defect location.

As shown in (a) of FIG. 8, the gray-level level judging part 141 generates the frame rate control and dithering data FDD that disperses the data of '01' to the four frames and the four pixels forming the group so that one gray level is compensated in any one frame of the first to fourth frames forming the frame group in each of the first to fourth pixels forming the pixel group and one gray level is compensated in any one pixel of the first to fourth pixels forming the pixel group in each of the first to fourth frames.

For example, the gray-level level judging part 141 generates the frame rate control and dithering data FDD such as '1' (1 gray level compensation) to the first pixel of the first frame, '0' (0 gray level compensation) to the second pixel thereof, '0' (0 gray level compensation) to the third pixel thereof, '0' (0 gray level compensation) to the fourth pixel thereof, '0' (0 gray level compensation) to the first pixel of the second frame, '1' (1 gray level compensation) to the second pixel thereof, '0' (0 gray level compensation) to the third pixel thereof, '0' (0 gray level compensation) to the fourth pixel thereof, '0' (0 gray level compensation) to the first pixel of the third frame, '0' (0 gray level compensation) to the second pixel thereof, '1' (1 gray level compensation) to the third pixel thereof, '0' (0 gray level compensation) to the fourth pixel thereof, '0' (0 gray level compensation) to the fourth pixel of the first frame, '0' (0 gray level compensation) to the second pixel thereof, '0' (0 gray level compensation) to the third pixel thereof, and '1' (1 gray level compensation) to the fourth pixel thereof.

The compensation value (R/G/B compensation value) can be determined as a value that compensates for 1 or more gray levels for the input digital video data Ri/Gi/Bi which are to be supplied to the panel defect location. In this case, the compensation value (R/G/B compensation value) includes an integral part and a fractional part. For example, the compensation value (R/G/B compensation value) for compensating a 3.25 gray level includes the integral part '3.00' and the fractional part '0.25', and '0.25 (¼)' among these can be expressed as the binary data of '01' as in the above and '3.00' can be expressed as '11' is the binary data of 2 bits. Such an integral part can be expressed as the number of various bits in accordance with the threshold value of the compensation value (R/G/B compensation value). In this way, when '3.00' is expressed as '11' and '0.25' is expressed as '01', the compensation value (R/G/B compensation value) can be expressed as the data of 4 bits like '1101' by having upper 2 bits as the integral part and lower 2 bits as the fractional part. In case that the binary data of '1101' like this are supplied to the gray-level level judging part 141, the gray-level level judging part 141 judges the binary data of '1101' as the compensation value (R/G/B compensation value) that compensates for the '3.25' gray level for the input digital video data Ri/Gi/Bi that are to be displayed to the panel defect location, and generates the frame rate control and dithering data FDD that disperses the data of '1101' to the four frames and four pixels forming the group.

For example, the gray-level level judging part 141 generates the frame rate control and dithering data FDD such as '1101' in the first pixel of the first frame, '1100' in the second pixel thereof, '1100' in the third pixel thereof, '1100' in the fourth pixel thereof, '1100' in the first pixel of the second frame, '1101' in the second pixel thereof, '1100' in the third pixel thereof, '1100' in the fourth pixel thereof, '1100' in the first pixel of the third frame, '1100' in the second pixel thereof, '1101' in the third pixel thereof, '1100' in the fourth pixel thereof, '1100' in the first pixel of the fourth frame, '1100' in the second pixel thereof, '1100' in the third pixel thereof, and '1101' in the fourth pixel thereof.

The operator 142 increases or decreases the input digital video data Ri/Gi/Bi with the frame rate control and dithering data FDD to generate the corrected digital video data Rc/Gc/Bc.

The liquid crystal display device according to the embodiment includes the compensating part 105 that is controlled by the frame rate control and dithering method and can express the subdivided gray level and color difference. When the liquid crystal display device which is driven with the digital video data where the R,G,B data each are 8 bits and where 256 gray levels can be expressed for each of the R, G, B, the liquid crystal display device includes the compensating part 105 controlled by the 4×4 frame rate control and dithering method, thereby subdividing the expressible gray level into 1021 gray levels for each of R,G,B. The liquid crystal display device according to the embodiment of the present invention corrects the brightness difference of the non-defect location and the panel defect location with the subdivided gray level, thereby enabling to realize the natural and find picture quality.

The foregoing compensating part 105 can be integrated into one chip along with the timing controller 104.

In the above embodiment, the case of applying the compensating part 105 to the liquid crystal display device has been taken as an example, but the compensating part 105 can be applied to other flat panel display device than the liquid crystal display device.

As described above, the flat panel display device and the picture quality controlling method electrically compensates for the panel defect by use of the circuit, thereby enabling to increase the display quality even in the display panel where the panel defect exists.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A flat panel display device capable of compensating a panel defect electrically, comprising:

a display panel;

a memory that stores first location information about a panel defect location on the display panel and a first compensation value that is dispersed during a plurality of frame periods;

a compensating part that detects the data that are displayed at the panel defect location and adjusts the data displayed at the panel defect location with the first compensation value from the memory;

an interface circuit communicating between the compensating part and an external system; and a register temporarily storing second location information and a second compensation value transmitted through the interface circuit in order to renew the first location information and first compensation value, wherein the external system supplies the second location information and second compensation value to the register through the interface circuit;

wherein the compensating part includes:

1) a location finding part that judges the first location of the data by use of any one or more of a vertical synchronization signal, a horizontal synchronization signal, a dot clock and a data enable signal;

2) a gray level analyzing part that analyzes the gray level area of the data;

3) an address generating part generates a read address that is for access to the memory by use of the gray level information and the first location of the data supplied from the location judging part and the gray level analyzing part;

4) a frame rate controlling part that disperses the first compensation value loaded from the memory to a plurality of frames by the frame rate control method;

wherein the frame controlling part includes:

1) a frame number sensing part that senses the number of frames by use of any one of the vertical synchronization signal, the horizontal synchronization signal, the dot clock and the data enable signal;

2) a gray-level judging part which judges the level of the gray level of the first compensation value and generates frame rate control data by use of a frame information from the frame number sensing part;

3) an operator that generates a corrected data by increasing or decreasing the data with the frame rate control data.

2. The flat panel display device according to claim 1, wherein the first compensation value is different for each location of the panel defect location and for each gray level of the data that are displayed at the panel defect location.

3. The flat panel display device according to claim 1, wherein the first compensation value includes an R compensation value that compensates for the red data, a G compensation value that compensates for the green data and a B compensation value that compensates for the blue data; and wherein the R compensation value, the G compensation value and the B compensation value are the same value in the same panel defect location and in the same gray level.

4. The flat panel display device according to claim 1, wherein the first compensation value includes a R compensation value that compensates for the red data, a G compensation value that compensates for the green data and a B compensation value that compensates for the blue data; and wherein at least one compensation value of the R compensation value, the G compensation value and the B compensation value is different from the other compensation value in the same panel defect location and in the same gray level.

5. The flat panel display device according to claim 1, wherein the memory includes a EEPROM.

6. The flat panel display device according to claim 1, wherein the display panel includes:

a liquid crystal display panel having a plurality of data lines that cross a plurality of gate lines and a plurality of liquid crystal cells, and wherein the driver includes:

a data drive circuit that supplies the corrected data to the data lines;

a gate drive circuit that supplies a scan pulse to the gate lines; and a timing controller that controls the drive circuits and supplies the corrected data to the data drive circuit.

7. The flat panel display device according to claim 6, wherein the compensating part is embedded in the timing controller.

* * * * *